(12) United States Patent
Amendt et al.

(10) Patent No.: US 9,864,069 B2
(45) Date of Patent: *Jan. 9, 2018

(54) SWITCHING FREQUENCY EXTENDED RANGE GEIGER DETECTION SYSTEM AND METHOD

(71) Applicant: Leidos, Inc., Reston, VA (US)

(72) Inventors: Eric Matthew Amendt, San Diego, CA (US); Ryan Shyffer, San Diego, CA (US)

(73) Assignee: Leidos, Inc., Reston, VA (US)

( * ) Notice: Subject to any disclaimer, the term of this patent is extended or adjusted under 35 U.S.C. 154(b) by 50 days.

This patent is subject to a terminal disclaimer.

(21) Appl. No.: 15/040,384

(22) Filed: Feb. 10, 2016

(65) Prior Publication Data
US 2016/0178760 A1    Jun. 23, 2016

Related U.S. Application Data

(63) Continuation of application No. 14/510,853, filed on Oct. 9, 2014, now Pat. No. 9,261,606.

(51) Int. Cl.
*G01T 1/18* (2006.01)
*H03B 5/20* (2006.01)
*H03B 5/32* (2006.01)

(52) U.S. Cl.
CPC ............ *G01T 1/18* (2013.01); *H03B 5/20* (2013.01); *H03B 5/32* (2013.01)

(58) Field of Classification Search
CPC .. G01T 1/18; G01T 5/06; G01T 1/171; H03K 5/22; H03B 5/20; H03B 5/32

USPC .......................................................... 250/375
See application file for complete search history.

(56) References Cited

U.S. PATENT DOCUMENTS

| | | | |
|---|---|---|---|
| 4,090,082 A | 5/1978 | Marshall, III et al. ....... 250/375 |
| 4,363,005 A * | 12/1982 | Kuroda ................ H02M 3/338 | 331/112 |
| 4,605,859 A * | 8/1986 | DiIanni et al. ........ G01T 1/171 | 250/374 |
| 4,631,411 A * | 12/1986 | Noback .................... G01T 1/17 | 250/374 |
| 5,206,513 A * | 4/1993 | Valentine ................. G01T 1/18 | 250/374 |
| 5,258,926 A * | 11/1993 | Duftschmid ............. G01T 1/18 | 250/375 |
| 6,194,882 B1 * | 2/2001 | Mirow ...................... G01T 1/18 | 323/222 |
| 6,388,250 B1 * | 5/2002 | Croydon ................ G01T 1/026 | 250/252.1 |
| 6,483,391 B1 * | 11/2002 | Magoon .................... H03L 5/00 | 331/182 |

(Continued)

*Primary Examiner* — Taeho Jo
(74) *Attorney, Agent, or Firm* — Dawn-Marie Bey; Bey & Cotropia PLLC (57) ABSTRACT

A Geiger-Mueller charge particle rate measurement system includes a clock management unit in combination with multiple oscillators and rate feedback controller to allow for reactive switching between the different oscillator frequencies to optimize system use. Controlling the clock management unit to send the appropriate frequency (clock signal) to the timers in response to measured rate date from the rate feedback controller facilitates operation at different clock speeds, which helps reduce power consumption when operated at lower speeds.

20 Claims, 5 Drawing Sheets

(56) References Cited

U.S. PATENT DOCUMENTS

| | | | |
|---|---|---|---|
| 7,111,496 B1* | 9/2006 | Lilienfeld | G01N 21/51 356/338 |
| 2003/0175806 A1* | 9/2003 | Rule | A61B 5/14532 435/7.1 |
| 2008/0303505 A1* | 12/2008 | Wing | H02M 3/33507 323/355 |

* cited by examiner

SWITCHING FREQUENCY EXTENDED RANGE GEIGER DETECTION SYSTEM AND METHOD

CROSS-REFERENCE TO RELATED APPLICATIONS

This application is a continuation of and claims priority to U.S. application Ser. No. 14/510,853, titled "Switching Frequency Extended Range Geiger Detection System and Method," filed Oct. 9, 2014, the disclosure of which is herein incorporated by reference in its entirety.

BACKGROUND

Field of the Embodiments

The present invention relates to a radiation measuring system and methods. More particularly, the present invention relates to radiation measuring apparatus and methods utilizing a single Geiger Mueller tube (GMT) that provides a count range extending from background dose rates on the order of 20×10-6 rads (R) per hour (20 µR/h) to high dose rates on the order of 1000 R/h.

Summary of the Existing Art

One of the most common and well-known radiation measuring apparatus is the geiger counter, sometimes called a Geiger-Mueller counter. The geiger counter detects ionizing radiation, including gamma rays and x-rays, and beta particles. At the heart of a geiger counter is a Geiger Mueller tube (GMT), which typically comprises a glass tube about 2 cm in diameter enclosing a metal cylinder, often of copper, about 10 cm long. (Other dimensions are, of course, also commonly used.) A thin metal wire, e.g. of tungsten, passes along the axis of the metal tube. The cylinder and wire are connected through an end wall of the glass tube to a source of electrical voltage. The tube is filled with a gas, usually a mixture of an inert gas, such as argon or neon, and a halogen, such as chlorine or bromine, at a low pressure, e.g., a few centimeters of mercury. A high voltage, e.g. 550 volts, is set up between the cylinder (which functions as the negative electrode or cathode) and the wire (which functions as the positive electrode or anode). This voltage is just a little less than that needed to create an electrical discharge between the two electrodes.

When a charged particle of sufficient energy enters the GMT, it knocks electrons out of the atoms of the gas. These electrons, being negatively charged, are attracted towards the wire anode, and the atoms from which the electrons originated (which become positively charged ions) are attracted towards the cathode. The high voltage established between the anode and cathode creates a high voltage gradient that accelerates the liberated electrons sufficiently to knock further electrons out of atoms, which in turn are accelerated by the high voltage gradient to knock still further electrons out of other atoms, creating an "avalanche" of electrons. As the avalanche of electrons continues, the positive ions are also accelerated towards the cathode wall. These positive ions strike the cathode wall with sufficient energy to release still additional electrons. All of these electrons descend on the anode wire and are detected as a pulse of electric current. The occurrence of this pulse thus indicates that a charged particle has passed through the tube. The electrical pulses can then be amplified and counted, using appropriate electronic counting circuitry, and/or converted to audible sound, to provide a user of the geiger counter a quantitative and/or qualitative measure of the number of charged particles encountered by the GMT.

Unfortunately, the rate at which charged particles can be detected by the GMT is limited. This is because during a discharge, i.e., during that time during which the electron avalanche is occurring, the GMT is insensitive to further charged particles arriving at the detector. Thus, some means must be employed to stop the electron avalanche, and to prepare the GMT to detect the next arriving charged particle.

One common technique used to help stop the avalanche is to reduce the voltage potential between the anode and cathode. Some reduction of this voltage occurs naturally as the electrical pulse developed on the anode effectively discharges the charged GMT (which may be considered prior to discharge as a charged capacitor). However, it is also known in the art to deliberately decrease the applied voltage potential for a sufficient time to allow the electron avalanche to sweep out of the GMT, at which time the voltage is again raised to a value just a little less than needed to create an electrical discharge. This process is described in U.S. Pat. Nos. 4,605,859 and 4,631,411. Using this prior art "sweep out" process, conventional GMT counters have a recovery time on the order of 10 µsec. Thus, conventional geiger counters are able to detect charged particles or radiation at a rate that is limited to no more than about 100,000 pulses per second. This recovery time significantly limits the high dosage rate at which radiation can be detected.

Using the "sweep out" process dosage rate is determined by measuring the period of the time between raising the anode voltage to its operating level and receiving the next Geiger pulse, i.e., time-to-count algorithm (or mode). This is a reciprocal rate measurement technique. The statistical accuracy of such measurement is improved by averaging successive measurements, but can only be as accurate as the starting point for measuring the Geiger period. Unfortunately, this starting point, when the anode voltage is precisely at its proper operating value, is not known with a great deal of certainty. Hence, as the Geiger period becomes shorter and shorter (higher and higher dosage rates), the uncertainty of the starting point of the period contributes a larger and larger error to the measurement. Because the measurement thus becomes increasingly inaccurate for short time intervals, reciprocal rate measurement instruments of the early prior art employed multiple GMTs; a relatively sensitive GMT to span the lower part of the dynamic range and a less sensitive GMT to span the upper decades.

Using the time-to-count algorithm, the rate, r, is calculated as follows. First, calculate the total time, $t_{Active}$, the GMT is active:

$$t_{Active} = \frac{N_t}{f_{osc}}$$

where $N_t$ is number of clock ticks and $f_{osc}$ is oscillator frequency. Next, calculate the mean time to count, $\mu_{time\ to\ count}$:

$$\mu_{time\ to\ count} = \frac{t_{Active}}{N_p}$$

$$r = \frac{1}{\mu_{time\ to\ count}}$$

where $N_p$ is number of clock ticks to pulse measurement and rate, r, may be calculated as:

$$\therefore r = f_{osc} * \left(\frac{N_p}{N_t}\right)$$

U.S. Pat. No. 5,206,513, the contents of which is incorporated herein by reference in its entirety, addresses the limitations of the conventional GMT counters summarized above and describes a portable radiation measurement device using a single GMT that has an operating range from background radiation levels on the order of 20 µR/h to high radiation levels on the order of 1000 R/h. U.S. Pat. No. 5,206,513 extends the measurement range of a single Geiger Mueller tube (GMT) using a system that may be operated in one of two modes; either a conventional mode, used to measure low radiation levels, e.g. background radiation, or an extended range geiger (ERG) mode, used to measure high radiation levels. Both modes utilize the same GMT and basic operating circuitry, including a power supply for generating a GMT anode voltage, a GMT anode voltage control circuit, a GMT trigger circuit, a clock circuit, and a GMT pulse counter circuit. In the conventional mode, the radiation rate is determined as a function of the number of GMT pulses counted over a prescribed time period, i.e., conventional pulse counting. In the ERG mode, an additional counter is employed to count trial intervals of a prescribed duration. The radiation rate is determined in the ERG mode statistically as a function of the ratio of the GMT pulse count and the trial interval count, with a prescribed number of trial interval counts being rejected after each GMT pulse in order to assure known initial conditions.

Using the conventional pulse count algorithm, the number of pulses $N_p$ is measured over a period of time and rate, r, is determined using:

$$r = f_{osc} * \left(\frac{N_p}{N_{clk}}\right)$$

Using the ERG algorithm, first calculate the probability of a non-event as follows:

$$P(>0) = \frac{N_p}{N_t} \Rightarrow P(0) = 1 - \frac{N_p}{N_t}$$

Apply Poisson arrival statistics:

$$P(x, \lambda) = \frac{\lambda^x e^{-\lambda}}{x!}$$

$$\lambda = \frac{r}{f_{osc}}$$

$$P(0) = \frac{\left(\frac{r}{f_{osc}}\right)^0 e^{-\frac{r}{f_{osc}}}}{0!} \Rightarrow P(0) = e^{-\frac{r}{f_{osc}}}$$

And calculate rate as follows:

$$\therefore r = f_{osc} * \ln\left(\frac{N_t}{N_t - N_p + \varepsilon}\right)$$

For each rate measurement algorithm described herein, the field strength, $R_{gamma}$, may be determined as follows:

$$R_{gamma} = \frac{r}{\text{Tube Sensitivity}}$$

The prior art systems described above face a common challenge and trade-off in implementation with respect to power consumption. More particularly, the upper limit of the radiation measurement algorithms (or modes) is a function of the GMT sensitivity to radiation and the frequency of the clock oscillator. Since power consumption increases linearly with clock frequency, the multiple GMT systems with single measurement mode, varying sensitivities are used to obtain a large dynamic range and maintain a low clock speed. This multiple GMT system reduces the clock speed required to measure high radiation fields but increases the size, weight and complexity of the device since multiple GMTs are required. The single GMT based, multiple measurement mode systems such as that described in U.S. Pat. No. 5,206,513 have lower size and weight but require more power to drive a higher clock rate to meet the full dynamic range requirement.

Accordingly, there remains a need in the art for a GMT-based radiation detection system which uses a single GMT to reduce size and weight while also reducing power.

SUMMARY OF THE EMBODIMENTS

In a first exemplary embodiment, a radiation measurement system includes: a single Geiger-Mueller tube for detecting one or more radiation particles; first control circuitry for controlling a voltage applied to the single Geiger-Mueller tube; a pulse counter for receiving radiation particle detection data from the Geiger-Mueller tube via the first control circuitry, converting the received radiation particle detection data to a pulse count; a rate detection module for receiving the pulse count and determining a radiation measurement rate therefrom; a clock management unit for providing timing controls including a clock signal and multiple time periods in synchronization therewith, the clock management unit supplying the timing controls to at least one timer; a rate feedback controller for receiving the radiation measurement rate from the rate detection module, determining in response thereto if a change in the clock signal should be made, and providing data regarding a determined change in the clock signal to the clock management unit; and multiple oscillators for maintaining the clock signal in response to instructions from the clock management unit.

In a second exemplary embodiment, a radiation measurement system includes: a single Geiger-Mueller tube for detecting one or more radiation particles; a rate detection module for receiving detection data and determining a radiation measurement rate therefrom; a rate feedback controller for receiving the radiation measurement rate from the rate detection module and determining if the radiation measurement rate is outside of a current oscillator frequency range; and a clock management unit for controlling at least two oscillators having different frequencies responsive to rate feedback data from the rate feedback controller.

In a third exemplary embodiment, a process for optimizing power consumption efficiency of a radiation measurement system includes: detecting one or more radiation particles; determining a radiation measurement rate by a rate detection module in response to received pulse count data indicative of detection of one or more radiation particles; determining by a rate feedback controller if the radiation measurement rate is outside of a current oscillator frequency range in response to the radiation measurement rate from the rate detection module; and controlling by a clock management unit multiple oscillators having varying frequencies in response to rate feedback data from the rate feedback controller and selecting an oscillator having a frequency that optimizes power consumption efficiency.

BRIEF SUMMARY OF THE FIGURES

The Summary of the Embodiments, as well as the following Detailed Description, is best understood when read in conjunction with the following exemplary drawings.

DETAILED DESCRIPTION

Figure 1:
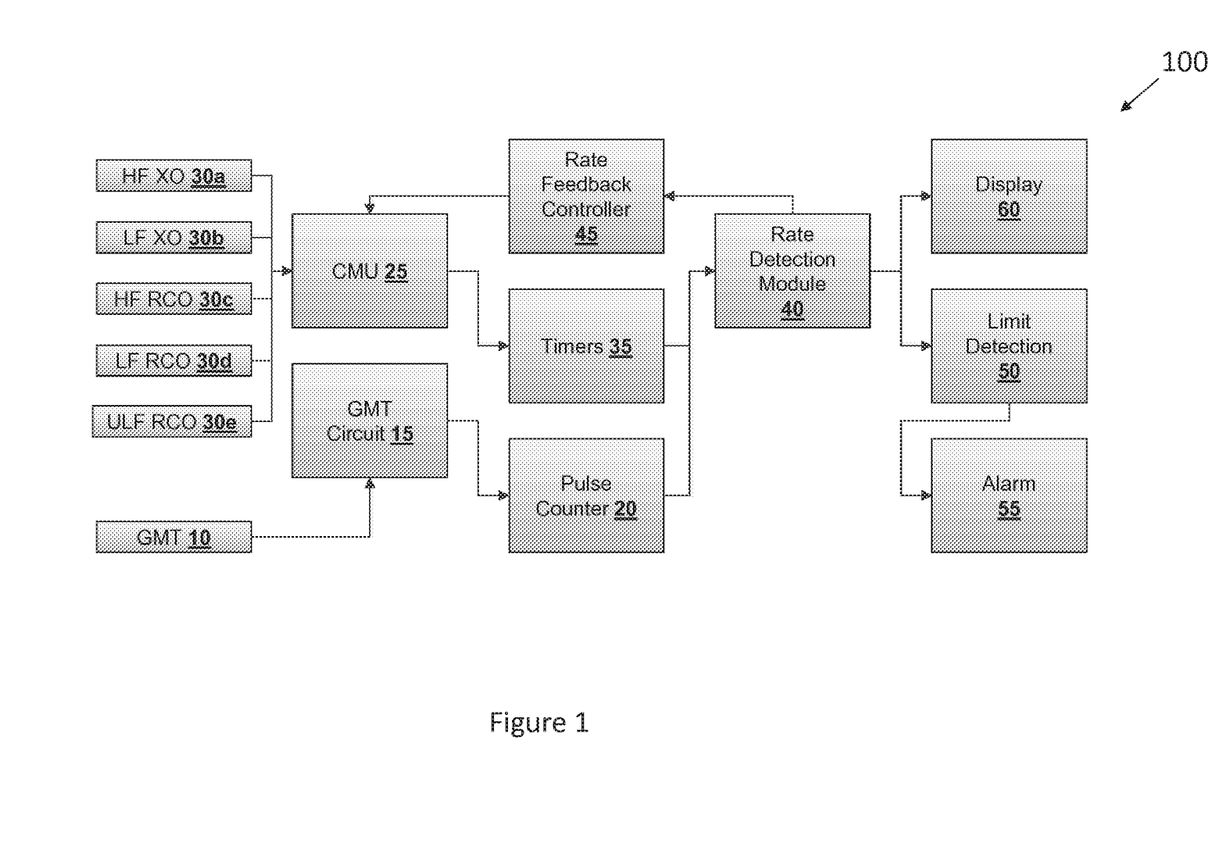
FIG. 1 is a schematic of an exemplary radiation measuring system in accordance with an embodiment described herein.

An exemplary radiation rate measurement system schematic in accordance with the embodiments herein is shown in FIG. 1. The exemplary radiation rate measurement system 100 includes at least the following components: GMT 10, GMT control circuit 15, pulse counter 20, clock management unit (CMU) 25, oscillators 30a-30e, timers 35, rate detection module 40, rate feedback controller 45, limit detector 50, alarm 55 and display 60. The operation and interaction of the system components is described further below and in commonly assigned U.S. Pat. No. 5,206,513, the entirety of which is incorporated herein by reference.

Initially, the GMT 10 interacts with ionizing radiation as is known in the art. The GMT control circuit 15 controls the GMT 10 voltage, maintaining it above the threshold voltage during radiation detection mode and lowering, when required, to sweep the GMT 10 tube. The GMT control circuit 15 converts photon interactions in the GMT 10 into pulses compatible with the pulse counter 20 which can detect or count pulses within predetermined time intervals ($N_p$) on the output of the GMT control circuit 15. After a GMT 10 pulse, the GMT Control Circuit 15 holds the GMT 10 voltage below the Geiger threshold for an amount of time sufficient for ions to sweep the GMT 10 tube before bringing the GMT 10 voltage above the Geiger threshold in anticipation of next pulse.

The pulse data ($N_p$) derived from pulse counter 20 is used in conjunction with timing data to determine radiation rates. The timing data ($N_t$) is derived from timers 35 which count clock ticks in accordance with the clock presented by the clock management unit (CMU) 25. A rate detection module (RDM) 40 calculates the photon interaction rate, r, from the pulse data ($N_p$) and timing data ($N_t$) using one or more known RDM algorithms, i.e., conventional pulse count, time-to-count and ERG, which are detailed in the Background and understood by those skilled in the art.

A critical and necessary component to each algorithm is the timing calculations, which are controlled by the CMU 25. In the exemplary system 100, the CMU 25 accesses five different oscillators 30a-30e. In the particular illustrated embodiment, there are two crystal oscillators including a high frequency crystal oscillator (HFXO), 48 MHz, divisible by 2N, 30a and a low frequency crystal oscillator (LFXO), 32.768 kHz, divisible by 2N, 30b. And three RC oscillators including high frequency (HFRCO), 28 MHz, divisible by 2N, 30c, low frequency (LFRCO), 32 kHz, divisible by 2N, 30d, and ultra low frequency (ULFRCO), 1 kHz, 30e. The CMU 25 controls routing of clock signals to different components of the system and is responsive to data received from the rate feedback controller 45 (discussed below in detail), as well as manual setting by a user. The CMU 25 functions include: starting and stopping oscillators as needed, dividing and multiplying clocks and routing clocks to system components, e.g., Microcontroller Unit Clock and peripherals such as SPI (Serial Peripheral Interface Bus), UART (Universal Asynchronous Receiver/Transmitter), USB (Universal Serial Bus). It is appreciated that the oscillator setting may also be manually selected by a user in accordance with intended use and expected level of radiation. The oscillators not only provide varying frequencies ($F_{osc}$) which may be stepped up and down with the multiplier/divisor 2, they also vary in start-up time and accuracy. For example, the crystal oscillators (HFXO, LFXO) have slower start-up (on the order of ms), but are highly accurate, whereas the RC oscillators offer quicker start-up (on the order of μs), but are less accurate. One skilled in the art recognizes that the exact number of oscillators need not necessarily be five, but may vary up or down, but always being greater than one, in order to meet timing configurations which may be required for a particular application.

A particular advantage of the present system of FIG. 1 over prior art systems is the addition of the CMU 25, oscillators 30a-30e, and rate feedback controller 45 and the operations and interactions therebetween. In operation, the CMU 25 divides and routes the appropriate oscillator 30a-30e to the timers 35 as defined by the rate feedback controller 45. The CMU 25 essentially acts as a controllable switch between the different oscillator frequencies available from oscillators 30a-30e and operates to turn the respective oscillators on and off in an efficient manner. Using the CMU 25 to send the appropriate frequency (clock signal) to the timers in response to measured rate date from the rate feedback controller 45 facilitates operation at different clock speeds, which reduces power consumption, since power consumption is generally linear with clock speed. That is, the ability to selectively run at a lower clock rate, also allows the system to run at a lower power. The ability to save power is particularly important for battery powered systems, such as those used in the field.

The system 100 also provides for external visual and/or auditory communication to a user through limit detector 50, alarm 55 and display 60. One skilled in the art appreciates the many potential applications for the system described herein, including personal safety, which call for an alarm when radiation levels are unacceptable or approaching an unacceptable level. Other applications include, but are not limited to, gamma and x-ray detection for search and survey.

Figure 2:
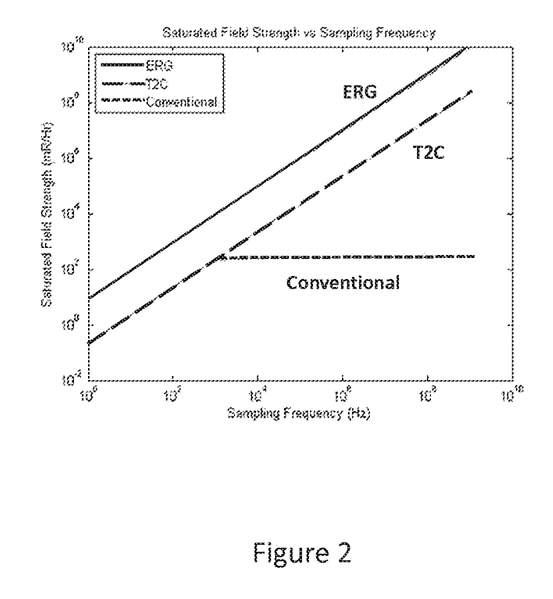
FIG. 2 illustrates the relationship between saturated field strength and sampling frequency for the rate measurement algorithms described with respect to certain embodiments herein.

FIG. 2 graphically illustrates the relationship between saturated field strength and sampling frequency for the rate measurement algorithms described herein. Higher timer frequencies use more power but are capable of measuring higher rates, while lower timer frequencies use less power but cause algorithm saturation at higher rates. During operation of the system, the rate feedback controller 45 uses data from RDM 40 to process against clock signal determination instructions therein to instruct the CMU 25 to issue the lowest appropriate timer clock frequency for the rate detected by the RDM 40. When moving from a low rate to a high rate, the rate feedback controller 45 instructs the CMU to progressively increase the timer clock until the RDM 40 returns a value appropriate for the clock rate. When moving from a high rate to a low rate, the RDM 40 measurement is accurate although inefficient, thus allowing the rate feedback controller 45 to immediately instruct the CMU 25 to provide the lowest appropriate timer frequency.

A further feature and function of the CMU 25 is clock management of peripheral devices, i.e., those devices that are peripheral to the rate measurement function. Many of these devices also require a clock. For example, a USB may be part of the overall system and may be used to communicate data externally to and from the system 100. USBs typically run at 48 MHz or some multiple thereof. Accordingly, regardless of what timer clock frequency may be most efficient for rate measurement, when the USB is in operation, the CMU 25 will necessarily be running the HFXO 30a.

Figure 3A:
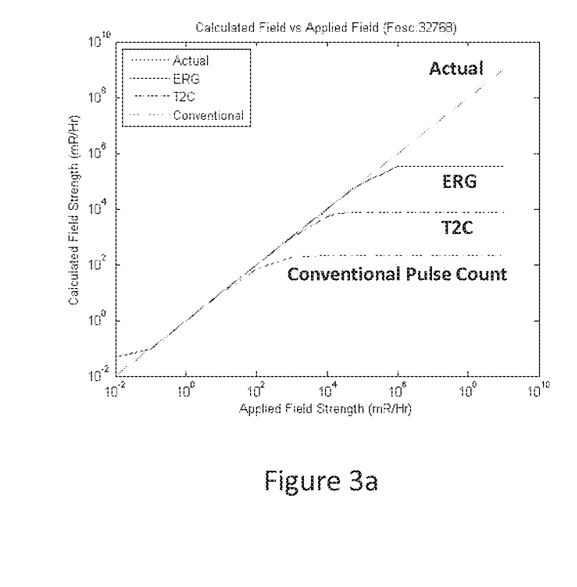
FIGS. 3a and 3b illustrate simulated system performance at different sampling rates for the rate measurement algorithms described with respect to certain embodiments herein.
Figure 3B:
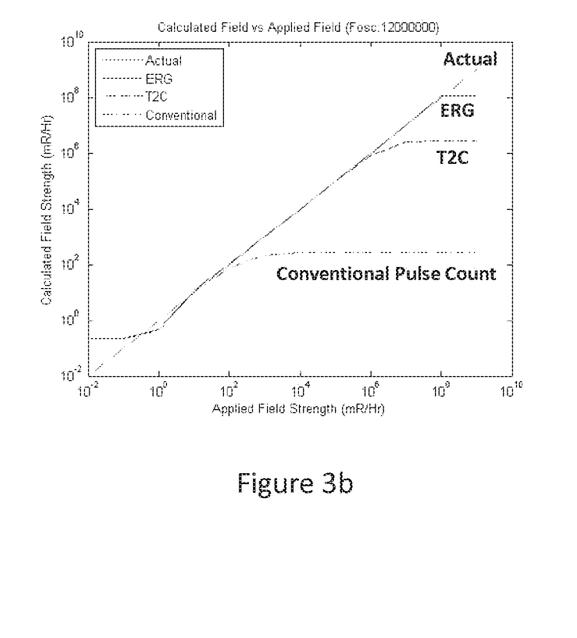

FIGS. 3a and 3b provide a graphical illustration of simulated system performance at different sampling rates. FIG. 3a illustrates the theoretical performance and breakdown (saturation) limits of each rate measurement algorithm discussed herein in the prior art scenario where there is only one available timer rate of 32.768 kHz. FIG. 3b illustrates theoretical performance of the same algorithms at a sampling rate of 12 MHz. The controller current differentials at these two different sampling rates, approximately 250 μA and approximately 5 mA, illustrate the expected power consumption difference.

Figure 4:
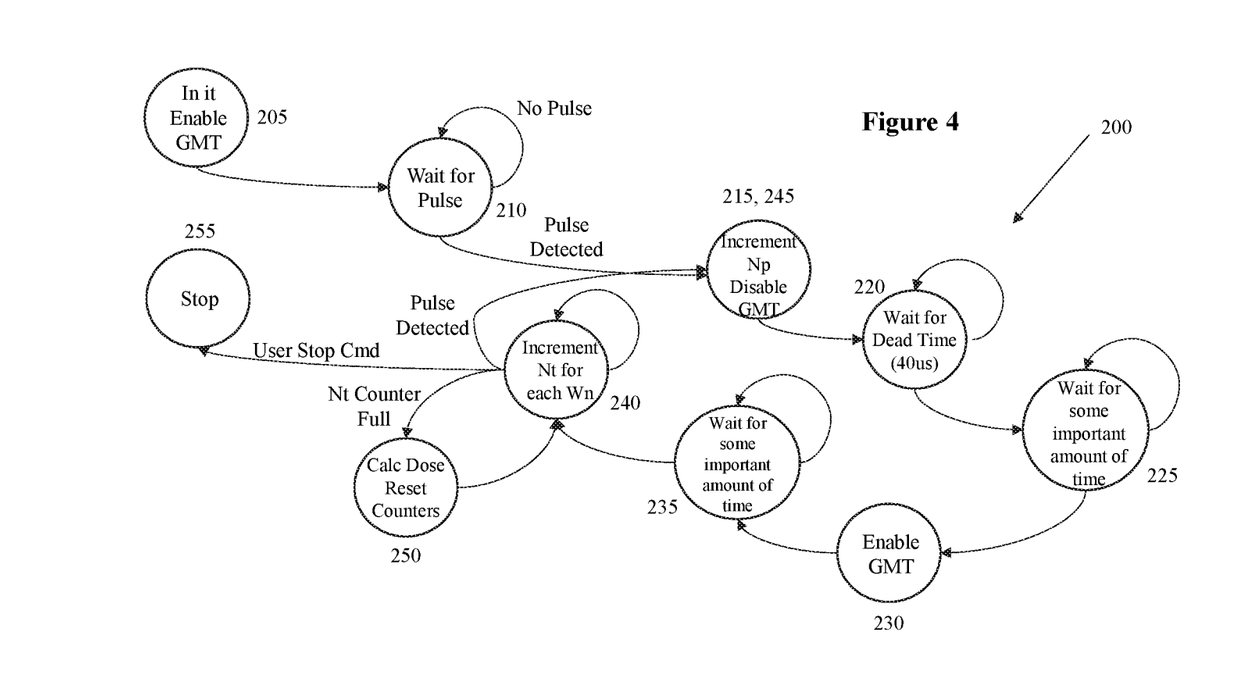
FIG. 4 illustrates an ERG state machine in accordance with a preferred implementation.

In a preferred embodiment, system 100 uses the ERG algorithm to calculate radiation rates. U.S. Pat. No. 5,206, 513 describes implementation of this algorithm in detail. FIG. 4 illustrates states of the system of FIG. 1 using the ERG algorithm and is referenced as ERG state machine 200 in accordance with a preferred implementation. The ERG state machine 200 controls the operation of a GMT for detection and measurement of charge particles. The GMT is initially enabled 205 and the system waits to detect a generated pulse 210 responsive to the detection of a charged particle. Once a pulse is detected, the GMT is disabled by reducing applied voltage below a threshold voltage required for detecting a charged particle 215. The system waits a first predetermined period of time subsequent to the application of the reduced applied voltage 220. This first predetermined time period is greater than the recovery time that is required to sweep the GMT, on the order of 40 μs. During this first predetermined period of time, also referred to as the "dead time," the GMT is unresponsive to additional events. The system then waits a second predetermined period of time, 225, before re-enabling the GMT through application of the threshold voltage 230 in readiness for detection of additional charge particles. This second predetermined period of time is also referred to as the "recovery time," during which time the GMT may react to an event but produces a lower amplitude pulse than what is required by the circuit. This recovery time period needs to be sufficiently long for the GMT to recover to full strength pulses. Finally, the system waits a third predetermined period of time subsequent to the application of the threshold voltage 235. The third predetermined period of time being sufficiently long to establish required initial conditions of the GMT to enable detection, i.e., time for the GMT to reach the appropriate high voltage.

Ideally, this third time period would be 0. A first counter is incremented at the end of the third predetermined period of time for each basic time interval that elapses prior to the detection of a charged particle by the GMT 240. The first counter maintains a count, $N_T$. A second counter is likewise incremented at the end of the third predetermined period of time for each charged particle detecting by the GMT 245. The second counter maintains a count, $N_P$. The process above continues until either the first counter is full, at which time the system determines a radiation count 250 or the process is stopped 255.

Figure 5:
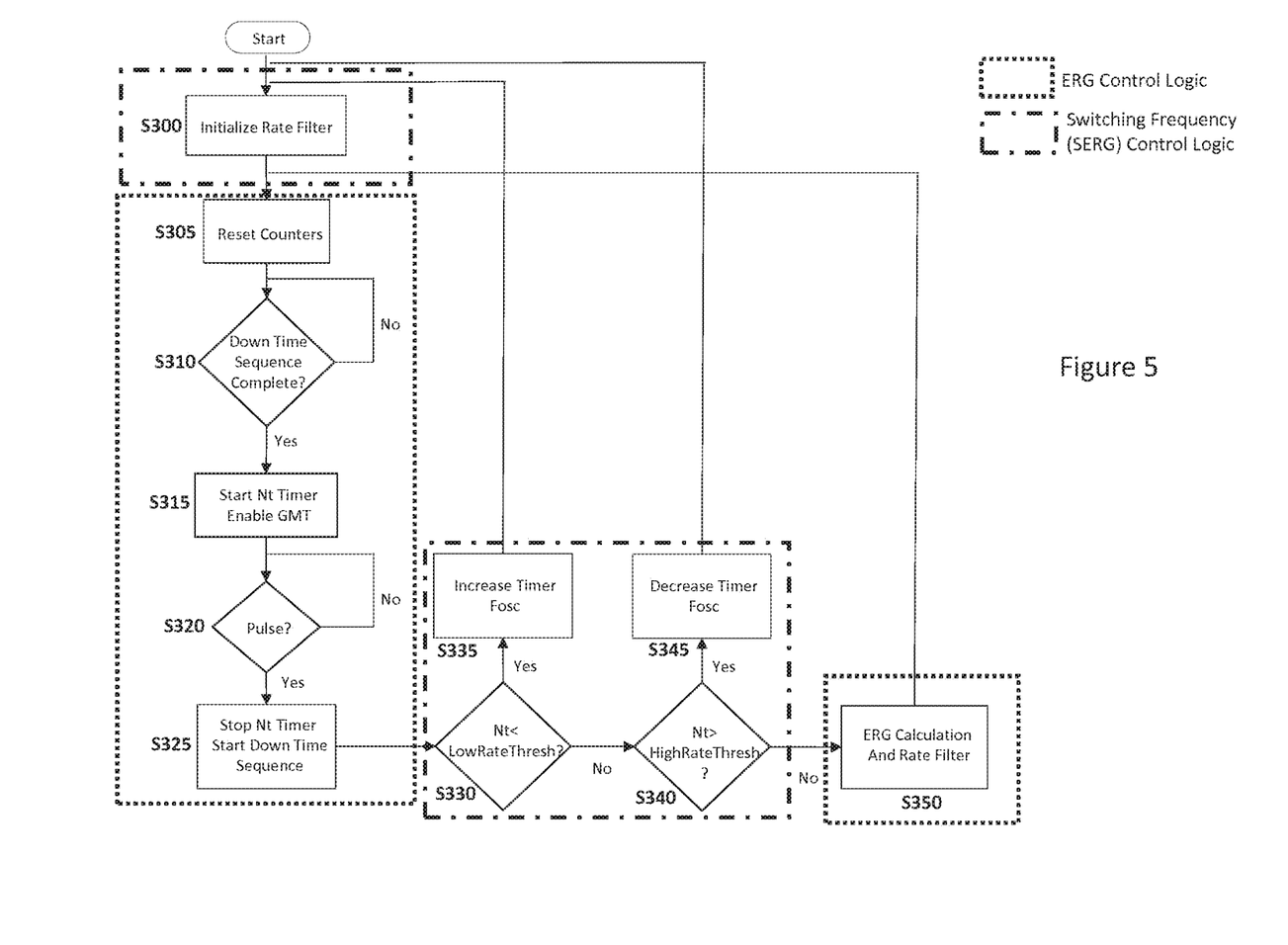
FIG. 5 provides an exemplary flow chart detailing the decision points and responsive actions of certain system components identified in FIG. 1.

FIG. 5 provides an exemplary flow chart detailing the decision points and responsive actions of certain system components identified in FIG. 1 implementing the switching frequency embodiments described herein. More particularly, at S300 the rate filter is initialized, rate counters are reset S305 and at decision point S310 the system determines if the GMT down time sequence is complete? If no, re-query until complete. Once completed, start first $N_T$ timer and enable GMT S315. At the next decision point, S320, wait for a pulse. When pulse is detected, stop first $N_T$ timer and initiate down time sequence S325. Is $N_T$ below the low rate threshold, S330? If yes, increase timer oscillator frequency ($F_{osc}$) accordingly S335 and return to S300. If no, check if $N_T$ is above the high rate threshold, S340? If yes, increase timer oscillator frequency ($F_{osc}$) accordingly S345 and return to S300. If no, perform ERG calculation S350 and return to S305. As indicated by the legend in FIG. 5, the process steps associated with existing ERG control logic are identified by a first border and the process steps associated with the switching frequency control logic of the present embodiments are identified by a second border.

The system described herein facilitates oscillator frequency selection and switching (or stepping) in order to balance detection demands, i.e., stay below the rate measurement algorithm saturation limit, and power savings. The system leverages the theoretical maximum limits of the above-described GMT rate measurement algorithms to determine the proper clock frequency for the counting algorithm timing. While the system is adaptable to all rate measurement algorithms commonly used, the ERG algorithm has demonstrated the best performance. One skilled in the art will appreciate the scenarios where stepping down/up will be necessary.

The switchable radiation detection system described herein benefits from the low size and weight of a single GMT based device and the ability to switch clock frequencies allows improved power performance allowing for longer operation time. This has particular appeal as a battery powered device.

In concluding the detailed description, it should be noted that it would be obvious to those skilled in the art that many variations and modifications can be made to the embodiments without substantially departing from the principles described herein. Also, such variations and modifications are intended to be included herein within the scope as set forth in the appended claims.

It should be emphasized that the above-described embodiments are merely possible examples of the implementations, merely set forth for a clear understanding of the principles of thereof. Any variations and modifications may be made to the above-described embodiments of without departing substantially from the spirit of the principles of the embodiments. All such modifications and variations are intended to be included herein within the scope of the disclosure.

The present invention has been described in sufficient detail with a certain degree of particularity. The utilities thereof are appreciated by those skilled in the art. It is understood to those skilled in the art that the present disclosure of embodiments has been made by way of examples only and that numerous changes in the arrangement and combination of parts may be resorted without departing from the spirit and scope thereof.

We claim:

1. A radiation measurement system comprising:
   a single Geiger-Mueller tube for detecting one or more radiation particles;
   a rate detection module for receiving detection data and determining a radiation measurement rate therefrom;
   a rate feedback controller for receiving the radiation measurement rate from the rate detection module and determining if a change to the radiation measurement rate should be made; and
   a clock management unit for controlling at least two oscillators having different frequencies responsive to rate feedback data from the rate feedback controller.

2. The radiation measurement system of claim 1, wherein the at least two oscillators include at least one crystal oscillator and at least one RC oscillator.

3. The radiation measurement system of claim 2, wherein the at least two oscillators include a high frequency crystal oscillator, a low frequency crystal oscillator and an ultra low frequency RC oscillator.

4. The radiation measurement system of claim 2, wherein the at least two oscillators include a high frequency crystal oscillator, a low frequency crystal oscillator, a high frequency RC oscillator, a low frequency RC oscillator and an ultra low frequency RC oscillator.

5. The radiation measurement system of claim 1, further comprising at least one peripheral device also connected to the clock management unit.

6. A process for measuring radiation comprising:
   detecting one or more radiation particles;
   determining a radiation measurement rate by a rate detection module in response to detection data;
   determining by a rate feedback controller if the radiation measurement rate should be changed; and
   controlling by a clock management unit at least two oscillators having different frequencies responsive to rate feedback data from the rate feedback controller.

7. The process according to claim 6, wherein determining if the radiation measurement rate should be changed includes comparing the radiation measurement rate to a low rate threshold; and
   if the radiation measurement rate is below the low rate threshold, selecting by the clock management unit an oscillator that increases the frequency.

8. The process according to claim 6, wherein determining if the radiation measurement rate should be changed includes comparing the radiation measurement rate to a high rate threshold; and
   if the radiation measurement rate is above the high rate threshold, selecting by the clock management unit an oscillator that decreases the frequency.

9. The process according to claim 6, wherein detecting one or more radiation particles further includes receiving at a pulse detector, radiation detection data from a Geiger-Mueller tube indicative of detection of one or more radiation particles, and converting the radiation detection data to pulse count data.

10. The process according to claim 6, wherein determining a radiation measurement rate utilizes a time-to-count algorithm.

11. The process according to claim 6, wherein determining a radiation measurement rate utilizes a pulse count algorithm.

12. The process according to claim 6, wherein determining a radiation measurement rate utilizes an extended range Geiger (ERG) algorithm.

13. The process according to claim 6, wherein the at least two oscillators include at least one crystal oscillator and at least one RC oscillator.

14. The radiation measurement system of claim 13, wherein the at least two oscillators include a high frequency crystal oscillator, a low frequency crystal oscillator and an ultra low frequency RC oscillator.

15. The radiation measurement system of claim 13, wherein the at least two oscillators include a high frequency crystal oscillator, a low frequency crystal oscillator, a high frequency RC oscillator, a low frequency RC oscillator and an ultra low frequency RC oscillator.

16. A radiation measurement system comprising:
    a rate feedback controller for receiving a radiation measurement rate and determining if a change to the radiation measurement rate should be made and
    a clock management unit for controlling at least two oscillators having different frequencies responsive to rate feedback data from the rate feedback controller.

17. The radiation measurement system of claim 16, wherein the at least two oscillators include at least one crystal oscillator and at least one RC oscillator.

18. The radiation measurement system of claim 17, wherein the at least two oscillators include a high frequency crystal oscillator, a low frequency crystal oscillator and an ultra low frequency RC oscillator.

19. The radiation measurement system of claim 17, wherein the at least two oscillators include a high frequency crystal oscillator, a low frequency crystal oscillator, a high frequency RC oscillator, a low frequency RC oscillator and an ultra low frequency RC oscillator.

20. The radiation measurement system of claim 16, further comprising at least one peripheral device also connected to the clock management unit.

* * * * *